(12) United States Patent
Pacilli et al.

(10) Patent No.: US 10,651,709 B2
(45) Date of Patent: May 12, 2020

(54) FAN ARBOR GROUNDING

(71) Applicant: GENTHERM GMBH, Odelzhausen (DE)

(72) Inventors: Chad Vincent Pacilli, Windsor (CA); Stephen Patrick Seguin, McGregor (CA); Nadim Ramadan, Irvine, CA (US); Jason Trout, Allen Park, MI (US); Matthew Jerome Wimsatt, South Lyon, MI (US)

(73) Assignee: GENTHERM INCORPORATED, Northville, MI (US)

( * ) Notice: Subject to any disclaimer, the term of this patent is extended or adjusted under 35 U.S.C. 154(b) by 129 days.

(21) Appl. No.: 15/964,203

(22) Filed: Apr. 27, 2018

(65) Prior Publication Data

US 2018/0331604 A1 Nov. 15, 2018

Related U.S. Application Data

(60) Provisional application No. 62/503,860, filed on May 9, 2017.

(51) Int. Cl.
| | | |
|---|---|---|
| *H02K 11/40* | (2016.01) | |
| *H05K 1/02* | (2006.01) | |
| *H02K 11/33* | (2016.01) | |
| *H02K 11/02* | (2016.01) | |
| *F04D 25/06* | (2006.01) | |
| *F04D 17/16* | (2006.01) | |
| *F04D 25/08* | (2006.01) | |

(52) U.S. Cl.
CPC ............ *H02K 11/40* (2016.01); *F04D 17/16* (2013.01); *F04D 25/0613* (2013.01); *F04D 25/0633* (2013.01); *F04D 25/0693* (2013.01); *F04D 25/08* (2013.01); *H02K 11/02* (2013.01); *H02K 11/33* (2016.01); *H05K 1/0215* (2013.01); *H02K 2211/03* (2013.01)

(58) Field of Classification Search
CPC ...... H02K 11/40; H02K 2211/03; H02K 11/33
USPC .......................................................... 310/71
See application file for complete search history.

(56) References Cited

U.S. PATENT DOCUMENTS

| | | | | |
|---|---|---|---|---|
| 5,357,160 A | * | 10/1994 | Kaneda ............... | H02K 5/225 310/67 R |
| 5,947,691 A | | 9/1999 | Brown et al. | |
| 6,013,966 A | * | 1/2000 | Fehrenbacher ...... | H02K 3/525 310/156.26 |
| 6,452,298 B1 | | 9/2002 | Fukuda et al. | |
| | | (Continued) | | |

FOREIGN PATENT DOCUMENTS

| | | |
|---|---|---|
| CN | 204200621 U | 3/2015 |
| DE | 102015211800 A1 | 12/2015 |

OTHER PUBLICATIONS

International Search Report and Written Opinion for International Application PCT/IB2018/000568, dated Aug. 30, 2018.

*Primary Examiner* — Hanh N Nguyen
(74) *Attorney, Agent, or Firm* — The Dobrusin Law Firm, P.C.

(57) ABSTRACT

A blower comprising: (a) a stator including: (i) one or more magnets and (ii) an impeller having a cup that receives the magnet; (b) a stator including: (i) an arbor; and (ii) motor windings; (c) a printed circuit board; and (d) a contact spring that extends between the arbor and the printed circuit board to ground the arbor.

20 Claims, 10 Drawing Sheets

(56) References Cited

U.S. PATENT DOCUMENTS

| | | |
|---|---|---|
| 6,509,704 B1 | 1/2003 | Brown |
| 6,841,112 B1 | 1/2005 | Brown et al. |
| 8,183,727 B2 | 5/2012 | Fee et al. |
| 8,314,522 B2 | 11/2012 | Ben et al. |
| 2004/0169426 A1* | 9/2004 | Segawa .................. H02K 5/00 310/36 |
| 2005/0275297 A1 | 12/2005 | Suzuki et al. |
| 2011/0050011 A1 | 3/2011 | Rhee et al. |
| 2014/0015363 A1* | 1/2014 | Kowa .................. H02K 5/16 310/156.01 |
| 2015/0180301 A1 | 6/2015 | Kajiyama |

* cited by examiner

FAN ARBOR GROUNDING

FIELD

The present teachings relate to an air mover with improved grounding.

BACKGROUND

Air movers include a rotor and a stator. Generally, an impeller shaft of the rotor extends through the stator and the rotor rotates about the stator. During movement of the rotor about the arbor, electromagnetic radiation may be generated within the system. The electromagnetic radiation may build up within the system and may interfere with performance of one or more components of the vehicle such as the radio. Attempts have been made to ground the various parts of the air mover.

Some examples of attempts to ground a fan may be found in U.S. Pat. Nos. 6,452,298; 8,183,727; and 8,314,522 and U.S. Patent Application Publication Nos. 2011/0050011 and 2015/0180301 the teachings of which are expressly incorporated by reference herein for all purposes. It would be desirable to have motor that is grounded through the printed circuit board during installation of the printed circuit board. What is needed is one or more contact springs that grounds the motor without any additional installation steps. It would be desirable to have one or more contact springs that contacts the arbor and the printed circuit board and removes electromagnetic radiation from the system so that the electromagnetic radiation does not interfere with surrounding electrical elements.

SUMMARY

The teachings of the present disclosure provide advantages discussed herein by providing: a blower comprising: (a) a stator including: (i) one or more magnets and (ii) an impeller having a cup that receives the one or more magnets; (b) a stator including: (i) an arbor; and (ii) motor windings; (c) a printed circuit board; and (d) one or more contact springs that extends between the arbor and the printed circuit board to ground the arbor.

The present teachings provide a motor that is grounded through the printed circuit board during installation of the printed circuit board. The present teachings provide one or more contact springs that grounds the motor without any additional installation steps. The present teachings provide one or more contact springs that contacts the arbor and the printed circuit board and removes electromagnetic radiation from the system so that the electromagnetic radiation does not interfere with surrounding electrical elements.

DETAILED DESCRIPTION

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

The present teachings may be used with any fan, blower, air mover, similar device that moves air, includes a motor with motor coils, or a combination thereof. As discussed herein fan, blower, and air mover are used interchangeably and the use of the term fan is intended to encompass a blower, air mover, or any other device that moves a fluid such as air, or a combination thereof. The fan may function to move air from a first location to a second location to provide heat, remove heat, provide cooling, or a combination thereof. The fan may move air within a component. For example, the fan may move air into a cooling cabinet or a housing that includes equipment, electrical components, or both. The fan may be located in a vehicle. Preferably, the fan may be connected to a vehicle seat. The fan may be attached to, located under, or both the bun of a seat, in the back of a seat, or both. The fan may extend into a cushion of a vehicle seat so that the fan is located within the vehicle seat. The fan may be suspended during use (e.g., from an insert, from a seat cushion, from a seat frame, or a combination thereof). Preferably, the fan may be connected to a vehicle battery.

The fan may be used in a vehicle to move a fluid through a vehicle seat. More preferably, the fan may be a low profile fan.

The present teachings are predicated upon providing a fan (i.e., a blower) that includes a housing, an impeller, a motor, and control instrumentation (e.g., circuitry). The housing may function to partially and/or fully enclose components of the fan, to generate a pressure differential so that air is moved, protect circuitry, or a combination thereof. The housing may enclose all of the functional components of the fan. The housing may connect the fan to channels, an air source, a thermoelectric device, may include a thermoelectric device, or a combination thereof. The housing may connect the fan to one or more devices so that the fan is retained within a device and/or system. For example, the fan may connect to a seat by the housing so that the fan may move air through the seat. A stator may be connected to the housing so that the stator supports a rotor.

The rotor may function to rotate and move air. The rotor may rotate about an axis, a shaft, or both. The rotor may rotate about the impeller shaft. The rotor may be located within and/or include one or more bearings so that the rotor has low friction rotation. The rotor may include one or more magnets, a cup, an impeller, or a combination thereof. The rotor may be an impeller or include an impeller that functions to move air. The impeller may push air, pull air, or both. The impeller may be made of any material so that the impeller moves air. Preferably, the impeller is made of plastic or a light-weight material. The impeller may be made of a molded material, an injection molded material, or both. The impeller may be made of metal. The impeller may be large enough so that the impeller moves a sufficient amount of air to heat and/or cool an occupant, a user, a location of interest, or a combination thereof. The impeller may be sufficiently small so that the rotor fits within a component and preferably a vehicle component. Preferably, the impeller may be formed by injection molding and/or overmolding. The impeller may be molded around a cup, an impeller shaft, one or more magnets, a plurality of magnets, or a combination thereof forming the rotor.

The cup may function to substantially surround the stator, house one or more magnets, connect to an impeller shaft, or a combination thereof. The cup may be an integral part of the impeller. The cup may form a connection with the impeller so that the impeller is balanced, the impeller is positioned relative to the impeller shaft, or both. The cup may be fixedly connected to an impeller shaft. The cup may connect the impeller shaft to the impeller. The cup may be permanently connected to the impeller shaft. The cup may fixedly connect to one or more magnets so that the one or more magnets are not directly connected to the impeller, the one or more magnets move the impeller around the stator, or both. The cup may be at least partially molded into the impeller, press fit into the impeller, or both. The cup may be connected to a single annular magnet. Preferably, the cup is connected to one or more magnets and even a plurality of magnets.

The one or more magnets may function to move the rotor during operation of the fan. The one or more magnets may be a solid annular magnet. The one or more magnets may be segments of magnets that are connected to the cup to form a ring. The one or more magnets may rotate about the stator when the windings are activated. An electromagnetic field may act upon the magnets so that the magnets move the impeller. The rotor may include a sufficient amount of the one or more magnets so that the rotor rotates, air is moved, or both. The one or more magnets may be positioned relative to the stator by the position of the cup, by the connection of the one or more magnets to the cup, or both.

The position of the cup may be determined by a connection with the impeller shaft. The impeller shaft may function to form a movable connection with the stator so that the rotor is movable. The impeller shaft may be press fit into one or more bearings so that the impeller shaft rotates with the impeller but connects the rotor to the stator. An end of the impeller shaft may extend beyond the bearing and so that a bearing surface is created. The bearing surface may be at the end of the impeller shaft that contacts a portion of the housing when the rotor rotates. The end of the impeller shaft may be free of contact with the housing. The end of the impeller shaft may move relative to the housing so that sometimes the impeller shaft is in contact with the housing and other times the impeller shaft is free of contact with the housing. The bearing surface may be a low friction surface that contacts the housing to support the rotor so that the rotor does not axially move in a first direction. The impeller shaft may be molded into the impeller so that a connection is formed between the impeller shaft and the cup, the impeller, or both. The impeller shaft may be press fit into the cup, the impeller, or both so that a connection is formed. Preferably, the impeller shaft is welded to the cup so that a connection is formed. The impeller shaft and cup may be welded together by any welding method so that a fixed connection is formed. The impeller shaft and cup may be welded together by laser welding, ultrasonic welding, friction welding, arc welding, tig welding, solid state welding, or a combination thereof. The impeller shaft and cup may be welded by any method so that the cup is balanced about the cup when a connection is finalized. The weld may add additional material to form the connection. The weld may be free of additional material to form the connection. The impeller shaft may be press fit into the cup and then a weld formed. The weld may only be on the outside of the cup or only on the inside of the cup. The weld may be a continuous weld around an outer periphery of the impeller shaft. The weld may be intermittently located about the impeller shaft. The impeller shaft, the cup, or both may be free of a tapered portion that assists in forming the connection between the cup and the impeller shaft. The cup may extend in a direction substantially perpendicular to the impeller shaft and a connection may be formed so that the cup and impeller shaft remain substantially perpendicular, without the using a tapered portion. The impeller shaft may align the rotor with the stator.

The stator may function to connect the rotor to the housing, to rotate the rotor, or both. The stator may rotate the rotor substantially about a rotational axis. The stator may be connected to the housing, one or more bearings, one or more printed circuit boards, or a combination thereof. The stator may have one or more windings that move the rotor via the one or more magnets of the rotor. The one or more windings when powered may create an electric field that moves the rotor and impeller so that air is moved. The rotor may be press fit into the stator or include a portion that is press fit into the stator (e.g., impeller shaft). The impeller shaft of the rotor may be connected to one or more bearings and then the one or more bearings and impeller shaft may be placed in the stator. The stator may include one or more motor coils, one or more arbors, one or more stator feet, or a combination thereof.

The one or more motor coils function to create an electric field that moves the rotor when the coils are electrified. The one or more motor coils may be a plurality of coils that extend around an arbor and when powered create an electromagnetic field that moves the rotor, which may also create electromagnetic radiation. The one or more motor coils may be a plurality of motor coils. The one or more motor coils may be equal in number to the number of magnets. There may be one or more motor coils than magnets or one more magnets than motor coils. The one or more motor coils may be electrically connected to a printed circuit board. The one or more motor coils may each include a plurality of wires (e.g., copper wires). The one or more motor coils may be connected to or located proximate to one or more arbors.

The one or more arbors function to mechanically ground the stator or connect the stator to the housing. The one or more arbors may connect the stator to the housing. The one or more arbors may be made of metal, a dielectric, or both. The one or more arbors may support the one or more motor coils. The one or more arbors may be connected to one or more bearings. One or more bearings may be press fit into the arbor so that the arbor supports the one or more bearings, the impeller shaft, or both. The one or more impeller shafts may extend into the one or more arbors. The one or more arbors may extend into a central recess of a printed circuit board. The one or more arbors may contact the one or more contact springs when the printed circuit board is installed around the one or more arbors. The one or more arbors may concentrate electromagnetic radiation, may ground the motor coils, or both. The one or more arbors, the one or more motor coils, motor coil housing, or a combination thereof may include one or more stator feet.

The one or more bearings may function to allow rotation of the rotor relative to the arbor while the arbor remains static. The one or more bearings may rotationally support the rotor, impeller shaft, or both while the rotor rotates about a rotational axis. The one or more bearings may be roller bearings, needle bearings, a bearing surface, a low friction surface that allows rotational movement of the impeller shaft and prevents axial movement of the impeller shaft, or a combination thereof. The one or more bearings may be located above or radially inward of the one or more stator feet so that the one or more bearings are free of blocking gaps between the stator feet.

The one or more stator feet may function to receive one or more windings, connect the windings to the printed circuit board, support the one or more windings, or a combination thereof. The one or more stator feet may extend radially outward from the arbor and be integrally connected to the arbor. One or more stator legs may be connected to the arbor and extend outward from the arbor to stator feet. The one or more legs, one or more feet, or both may transmit electromagnetic radiation through direct contact with the arbor, proximity to the arbor, or both. The one or more windings may be wound around the stator arms. The one or more stator feet may contact a printed circuit board. The one or more stator feet may be located proximate to the printed circuit board but not touch the printed circuit board. The one or more stator feet may be spaced apart by a gap. One or more contact springs may extend between the one or more arbors and the printed circuit board at a location proximate to the gap. Preferably, the one or more contact springs may be located proximate to a gap between stator feet and extend away from the stator feet into contact with the arbor.

The one or more contact springs function to dissipate electromagnetic energy generated by the fan motor (i.e. one or more motor coils) and thereby reduce or prevent electromagnetic interference between the fan and surrounding electrical devices, dissipate power, ground the one or more arbors, dissipate electromagnetic radiation, create a ground path/traces, or a combination thereof. The one or more contact springs may connect the one or more arbors to an electric ground (e.g. vehicle ground circuit and/or a chassis). The one or more contact springs may create an electrical path to the fan connector, the ground, or both. The one or more contact springs may connect to the printed circuit board which is connected to the fan connector (e.g., one or more power wires or power leads). The one or more springs may have a cantilever connection with the printed circuit board so that the one or more springs extend over the printed circuit board and into a central aperture. The one or more contact springs may extend radially inward towards a center of the central opening of the printed circuit boards. The one or more contact springs may move from an uninstalled state to an installed state when the printed circuit board is placed around the one or more arbors. The one or more contact springs may extend into a central aperture of the printed circuit board so that when the one or more arbors is placed within the central aperture the one or more contact springs contacts the one or more arbors. For example, the printed circuit board may include a central aperture in a central region of the printed circuit board that receives the arbor and the one or more contact springs may extend from the printed circuit into and/or above the central aperture to contact the arbor. The one or more contact springs may be sufficiently long so that the one or more contact springs when the uninstalled state contact the one or more arbors and flex so that a ground path/traces is created. The one or more contact springs may plastically deform, elastically deform, bend, flex, or a combination thereof when moved into contact with the one or more arbors. The one or more contact springs may be free of deformation or flexing when the one or more contact springs are in contact with the arbor. The one or more contact springs may connect the one or more arbors to a printed circuit board that is grounded. The one or more contact springs may include one or more spring contacts.

The one or more spring contacts function to electrically connect the PCB to the one or more arbors. The one or more spring contacts may form a fixed connection. The one or more spring contacts may form a movable connection. The one or more spring contacts may be a curved surface that contacts one or more arbors of the rotor. The one or more spring contacts may angle away from a spring arm in a direction opposite an installation direction. The one or more spring contacts may have an angle relative to a body of the one or more contact springs. For example, the one or more spring contacts may curve at an angle of about 25 degrees or more, about 45 degrees or more, about 60 degrees or more, about 75 degrees or more, or about 90 degrees or more relative to the body so that the one or more spring contacts can connect with or contact the one or more arbors. The one or more spring contacts may curve at an angle of about 105 degrees or less. The one or more spring contacts may have a length. The length of the one or more spring contacts may be in contact with the one or more arbors. The spring contact may be free of contact with the arbor in an installed position. The one or more spring contacts may assist the arbor in being placed through the central aperture during installation. The one or more spring contacts may prevent damage to the spring arm, the one or more contact springs, or both during installation. The one or more spring contacts may prevent the spring arm from being deformed if the spring arm were to contact a recess, channel, bump, or a combination thereof during installation. The one or more spring contacts may be located on a distal end of a spring arm (e.g., an end closest to the arbor), proximate to one or more bias bumps, or both.

The one or more spring arms function to extend between the printed circuit board and the arbor, between a body and the one or more spring contacts, to extend over the central aperture, or a combination thereof. The one or more spring arms may move with the arbor as the arbor moves. Preferably, the one or more spring arms are deflectable so that as the printed circuit board is installed relative to the arbor the one or more spring arms move to create a connection with the arbor. The one or more spring arms may extend away from the body and form a connection with the arbor. The one or more spring arms may include one or more bias bumps that assist the one or more spring arms in creating a connection with an arbor, maintaining a connection with an arbor, or both.

The one or more bias bumps function to maintain the spring in contact with the printed circuit board, in contact with the one or more arbors, or both. The one or more bias bumps may bias longitudinally (e.g., along a length of the one or more contact springs) or vertically (e.g., in a direction parallel to the axis of rotation of the impeller shaft). The one or more bias bumps may be a curved portion, a raised portion, a half circular portion, or a combination thereof. The one or more bias bumps may be flexible. The one or more bias bumps when flattened (i.e., pressed down) may bias the one or more contact springs longitudinally. The one or more bias bumps may be a bend in the one or more contact springs that reduces a total length of the one or more contact springs so that when the one or more bias bumps are biased the total length of the one or more contact springs increases when compared to the one or more bias bumps being bent. Preferably, the one or more bias bumps may be located between the one or more spring contacts and the one or more anchor legs. The one or more bias bumps may be located between the one or more spring contacts and the connection pad. The one or more bias bumps may be located between the one or more anchor legs and the connection pads. Preferably, the one or more bias bumps may be located on a spring arm. The one or more spring arms may be free of a bias bump. The one or more bias bumps may be located between the one or more spring contacts and the one or more anchor legs.

The one or more anchor legs function to contact or connect to the printed circuit board. The one or more anchor legs may extend into the printed circuit board (e.g., into an anchor leg recess). The one or more anchor legs may extend through the printed circuit board. The one or more anchor legs may create a surface mounted connection with the printed circuit board. Preferably, the one or more anchor legs physically connect the one or more contact springs with the printed circuit board. The one or more anchor legs may form a fixed mechanical connection, an electrical connection, or both with the printed circuit board. The one or more anchor legs may contact a ground. Preferably, the one or more contact springs includes a plurality of anchor legs. The one or more contact springs may include two or more anchor legs. The one or more anchor legs may be spaced apart by a leg gap. The one or more anchor legs may be separated by the leg gap and each anchor leg may be individually grounded, connected to the printed circuit board, or both. The one or more anchor legs may assist in grounding the one or more arbors, the one or more contact springs, or both but the mechanical connection with the printed circuit board may be through the connection pad. The one or more anchor legs may contact traces on the printed circuit board. The one or more anchor legs may extend from a proximal side of a body, a distal side of the body, or both. For example, the spring arm may extend from a distal side of a body and the one or more anchor legs may extend from a distal side of the body. The one or more anchor legs may extend from an opposing side and/or edge of the body than the spring arm. The one or more anchor legs may extend from a body of the one or more contact springs.

The body of the one or more contact springs may function to support the one or more anchor legs, the one or more spring arms, create a fixed connection, contact one or more traces, create an electrical connection, or a combination thereof. The body may be located between the one or more anchor legs and the spring arm. The body may have any shape that creates an electrical connection, supports the one or more spring arms, the one or more anchor legs, or a combination thereof. All or a portion of the body may be movable relative to the printed circuit board. Preferably, the body is connected to the printed circuit board and creates an electrical connection therebetween. The body may have one or more connection pads that create an electrical connection between the printed circuit board and the one or more contact springs, one or more support arms to support the body, or both The one or more support arms may function to prevent the body from rotating, twisting, or both. The one or more support arms may function to prevent the spring arm from rotating, twisting, or both. The one or more support arms may extend at an angle relative to the spring arm. Preferably, the one or more support arms extend perpendicular to the spring arm. The one or more support arms may extend from the body, the spring arm, or both. The support arms may be located entirely on a first side of the printed circuit board. The one or more support arms may extend from opposing sides of the body. The one body may be free of support arms. The one or more support arms may assist in the one or more connection pads to maintain a mechanical connection, an electrical connection, or both.

The one or more connection pads may function to mechanically, electrically, or both connect the one or more contact springs to the printed circuit board. The one or more connection pads may include or be a conductive grease. The one or more connection pads may be solder, a weld, or both. The one or more connection pads may form a permanent connection. The one or more connection pads may be a region of a body of the one or more contact springs that is in contact with the printed circuit board, a trace, a ground path, or a combination thereof. The one or more connection pads may elevate the body from the printed circuit board so that the spring arm extends above the printed circuit board. The one or more connection pads may be planar with the spring arm, the body, or both. The one or more connection pads, preferably, are the location of the one or more contact springs that is in contact with the traces or the printed circuit board and create the electrical and/or mechanical connection. The one or more connection pads may be connected via surface mounting, through-hole connection, or both. The one or more connection pads may form part of a ground path/traces. The one or more connection pads may connect to a printed circuit board.

The one or more printed circuit boards (PCB) may be grounded. The one or more PCB may function to provide power, signals, a ground, or a combination thereof to one or more circuit elements within a system (e.g., the blower). The one or more PCB may connect one or more components together electrically, mechanically, or both together or to system. The one or more PCB may be electrically connected, physically connected, or both to the one or more contact springs. The one or more PCB may connect the one or more contact springs to a ground so that electromagnetic radiation created by the one or more motor coils is dissipated. The one or more PCB may include a connection plate that connects to the one or more contact springs.

The one or more connection plates of the printed circuit board function to provide and/or receive power or signals from the one or more contact springs. The one or more connection plates may electrically connect the printed circuit board and the one or more contact springs. The one or more connection plates may physically connect the printed circuit board and the one or more contact springs. The one or more connection plates may surface mount with the one or more contact springs. The connection plates may include one or more through-holes to connect to the one or more contact springs. The connection plates may be connected to ground path/traces, one or more grounds, a ground path, or a combination thereof. The one or more connection plates may be aligned with one or more anchor leg recesses through the printed circuit board.

The one or more anchor leg recesses may function to receive all or a portion of the one or more anchor legs of the one or more contact springs. The one or more anchor leg recesses may receive the one or more anchor legs and receive a force or torque from the one or more contact springs being moved from an uninstalled position to an installed position. The one or more anchor leg recesses when in contact with the one or more anchor legs may prevent stress from being placed on the connection pads, connection plates, connection material, solder, or a combination thereof. Each of the anchor leg recesses may connect to one anchor leg. The anchor leg recesses may space the one or more contact springs a predetermined distance from the arbor so that the one or more contact springs is not damaged during installation. The one or more anchor leg recesses may form a friction fit with the one or more anchor legs.

Figure 1A:
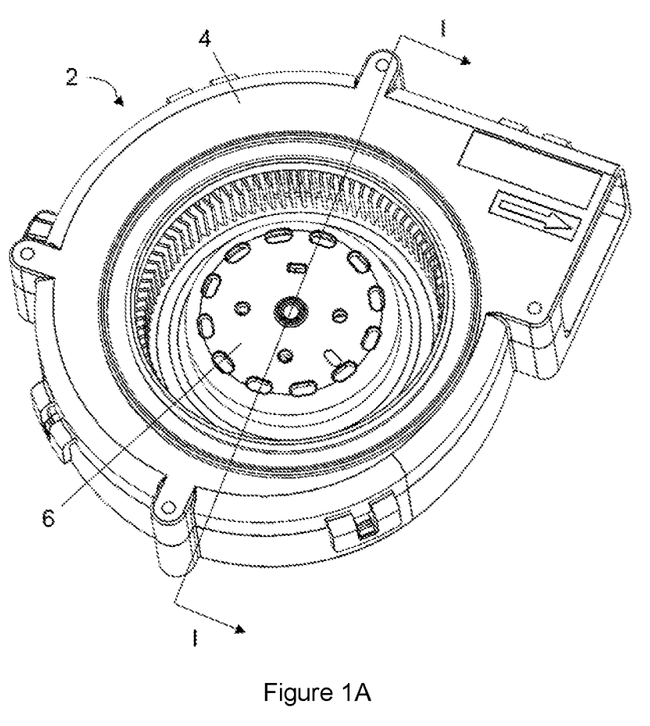
FIG. 1A illustrates a perspective view of a blower.

FIG. 1A illustrates a blower 2. The blower 2 includes a housing 4 that surrounds an impeller 6.

Figure 1B:
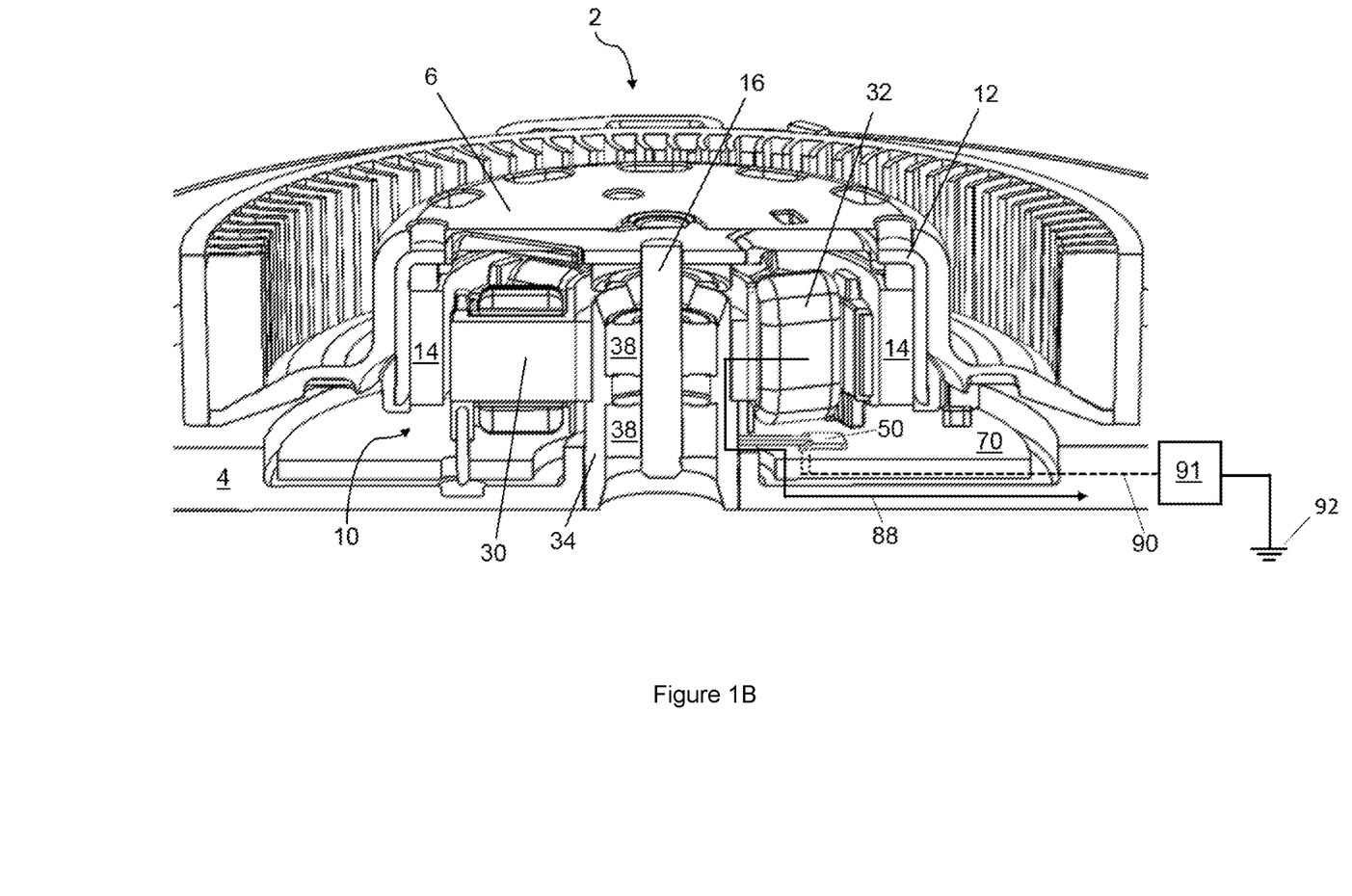
FIG. 1B illustrates a cross-sectional view of a blower along line I-I.

FIG. 1B illustrates a cross-sectional view of a blower 2 along line I-I. The blower 2 includes the housing 4 that surrounds the impeller 6, a rotor 10, and a stator 30. The rotor 10 includes the impeller 6 with a cup 12 that houses one or more magnets 14. The cup 12 is connected to an impeller shaft 16 that extends into the stator 30. The impeller shaft 16 is separated from the stator 30 and one or more arbors 34 by one or more bearings 38. The stator 30 includes one or more motor coils 32 that generate electromagnetic radiation (EMR) 88 during operation. The EMR 88 is received through the one or more arbors 34 and conducted by one or more contact springs 50 to ground path/traces 90 on one or more printed circuit boards (PCB) 70 that are connected to a ground 92 via a fan connector 91.

Figure 2A:
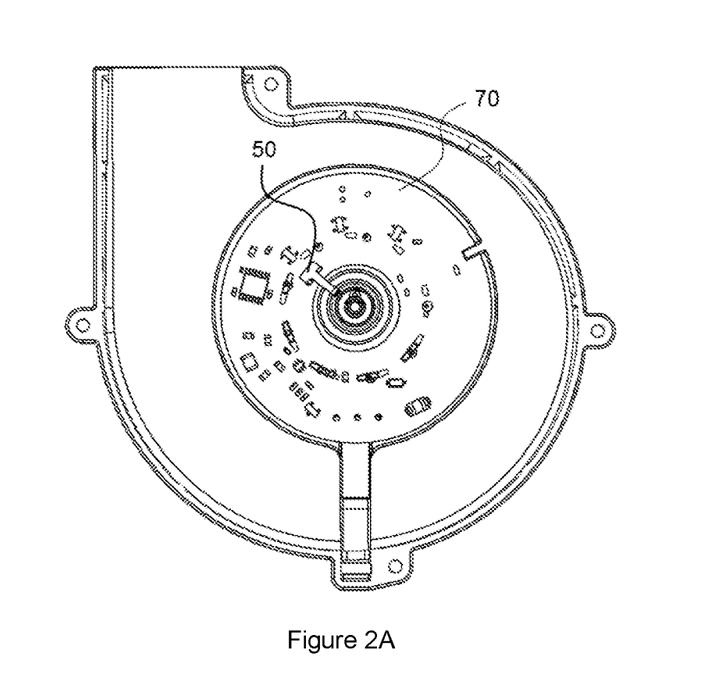
FIG. 2A illustrates a plan view of one or more contact springs and a printed circuit board.

FIG. 2A is a top view of the printed circuit board 70 and the one or more contact springs 50 on the printed circuit board 70.

Figure 2B:
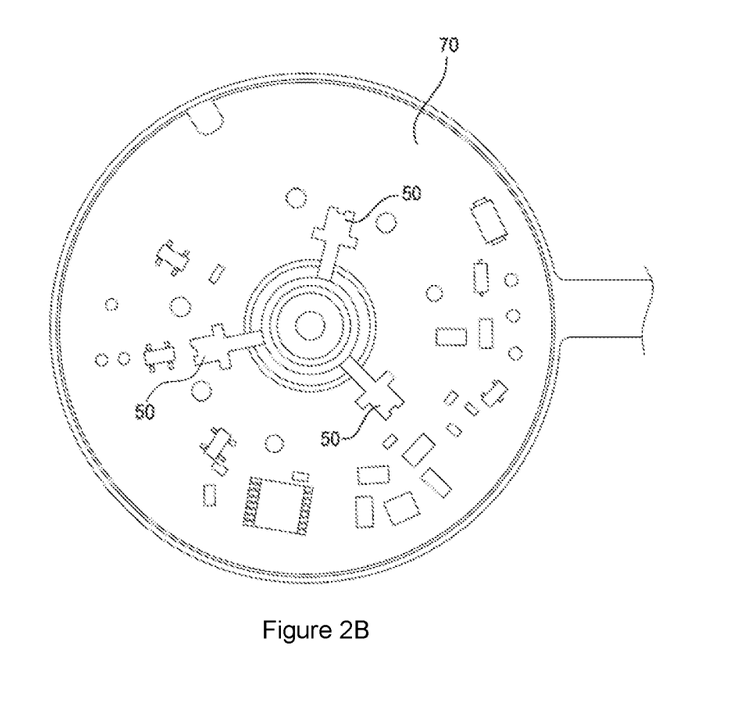
FIG. 2B illustrates a plain view of one or more contact springs and a printed circuit board.
Figure 3A:
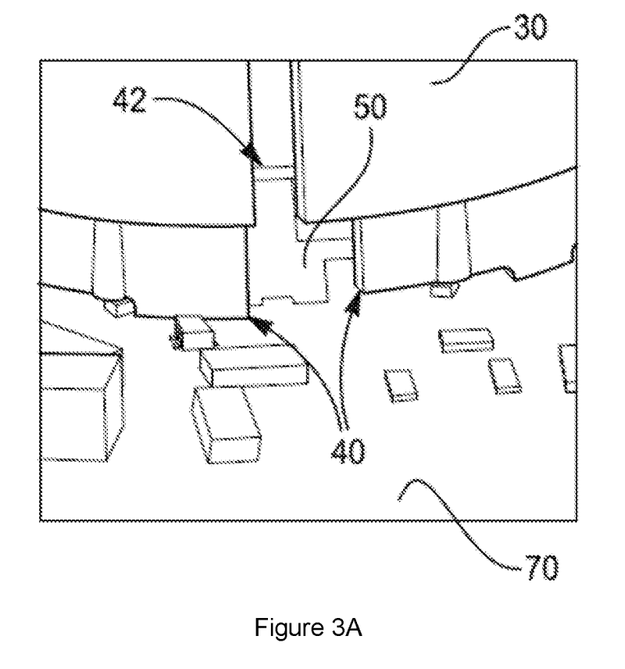
FIG. 3A illustrates a close-up view one or more contact springs proximate to a gap in the stator.
Figure 3B:
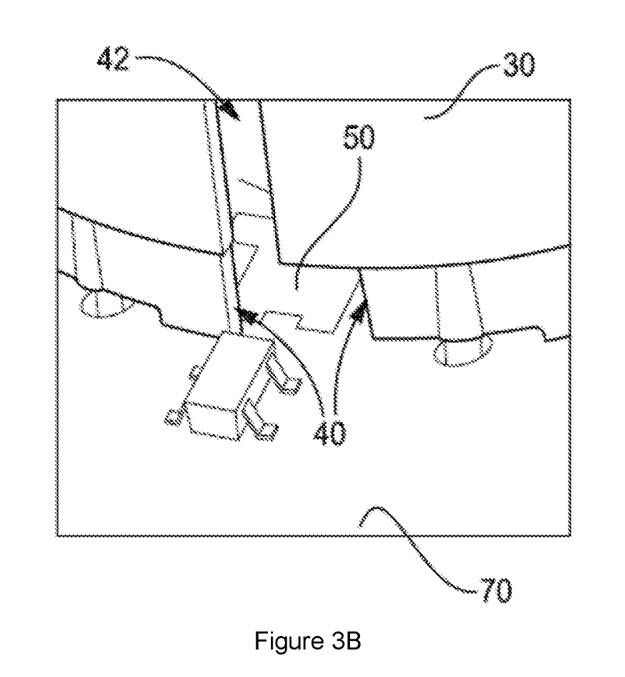
FIG. 3B illustrates a close-up view of one or more contact springs through a gap in the stator.
Figure 4A:
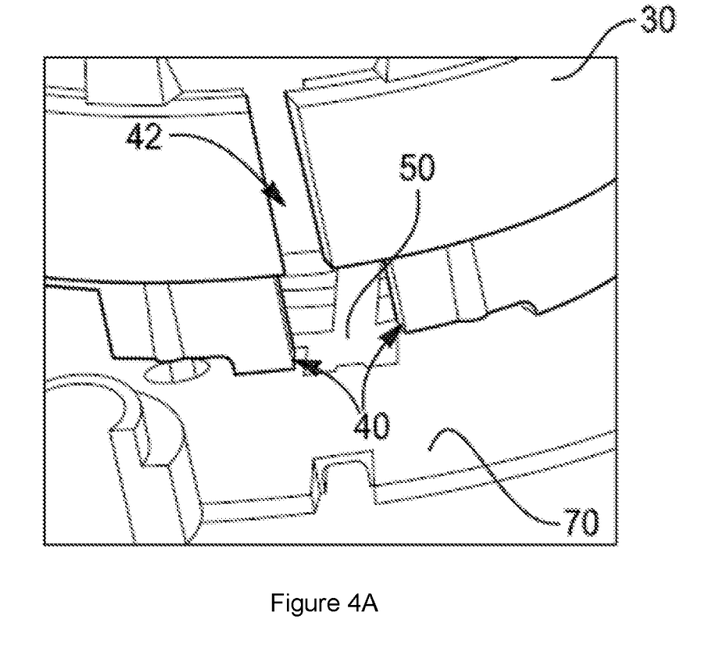
FIG. 4A illustrates a close-up view of one or more contact springs and printed circuit board.
Figure 4B:
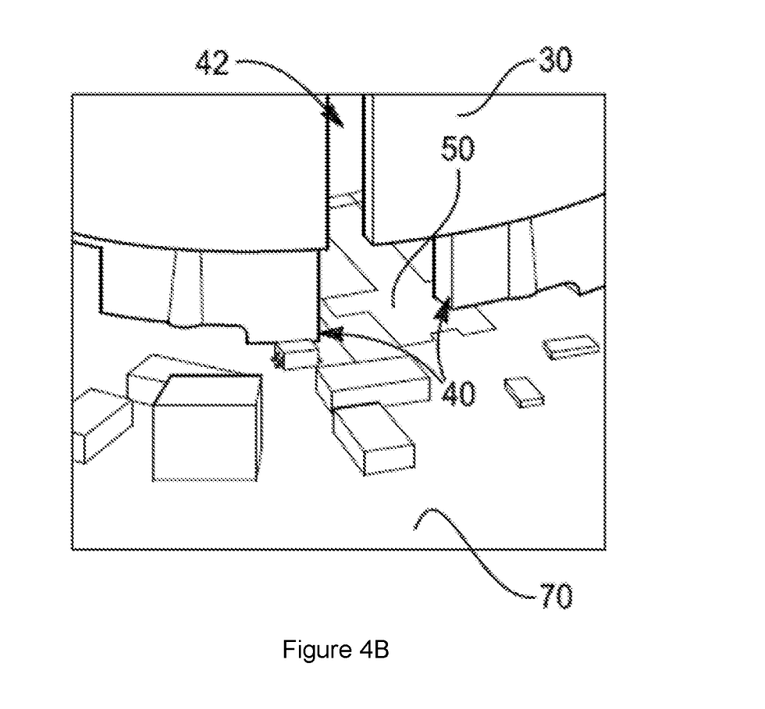
FIG. 4B illustrates a close-up view of one or more contact springs and printed circuit board.

FIG. 2B is a top view of the printed circuit board 70 and three of the one or more contact springs 50 spaced apart on the printed circuit board 70.

FIGS. 3A, 3B, 4A, and 4B illustrate close-up views of the stator 30 and stator feet 40. The stator feet 40 are separated by a gap 42. The one or more contact springs 50 are visible through the gap 42 and is connected to the printed circuit board 70.

Figure 5:
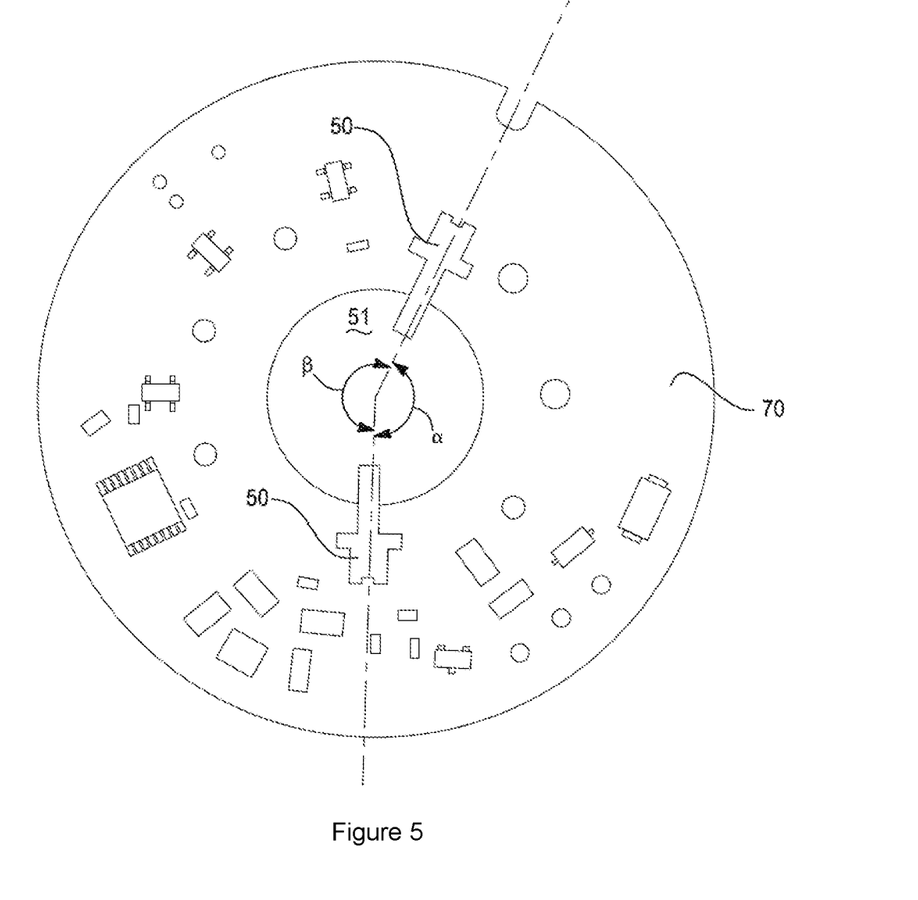
FIG. 5 illustrates a plan view of a printed circuit board and one or more contact springs.

FIG. 5 illustrates a printed circuit board 70 including two spaced apart one or more contact springs 50. The one or more contact springs 50 are separated by angle (α) on a first side and angle (β) on a second side. The one or more contact springs 50 extend radially inward into and cantilever over a central aperture 51 through which the one or more arbors (not shown) passes.

Figure 6A:
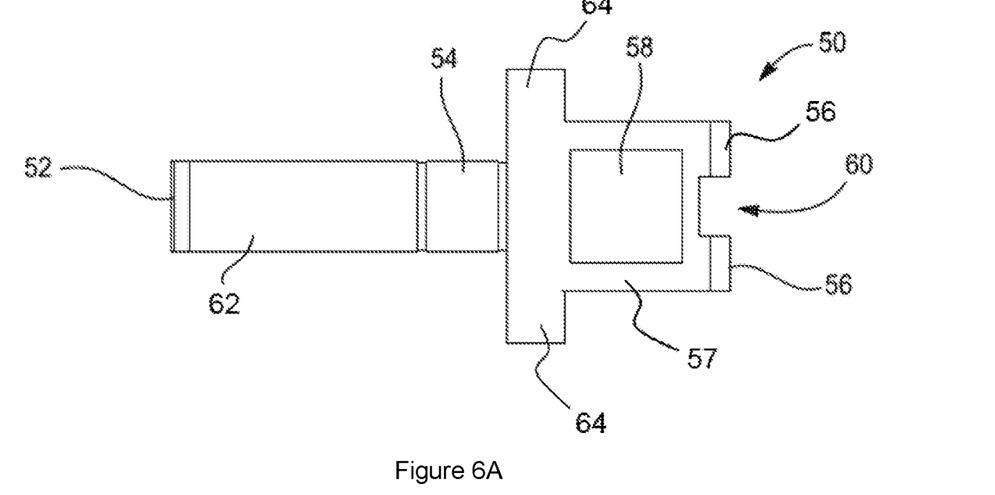
FIG. 6A illustrates a plan view one or more contact springs.
Figure 6B:
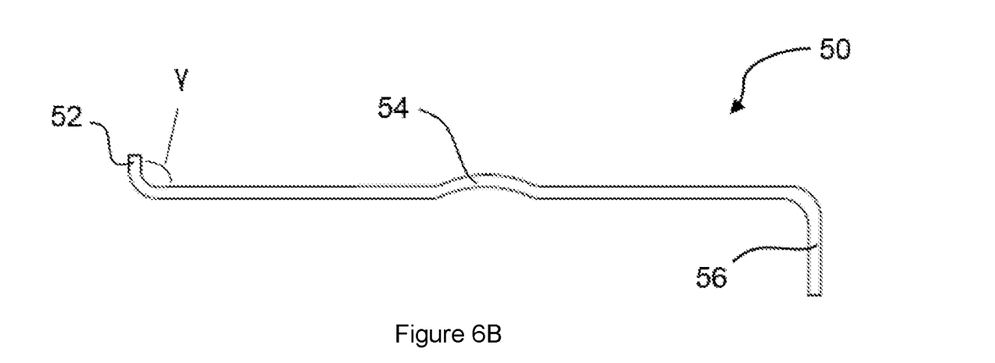
FIG. 6B is a side view of the one or more contact springs of FIG. 6A.
Figure 6C:
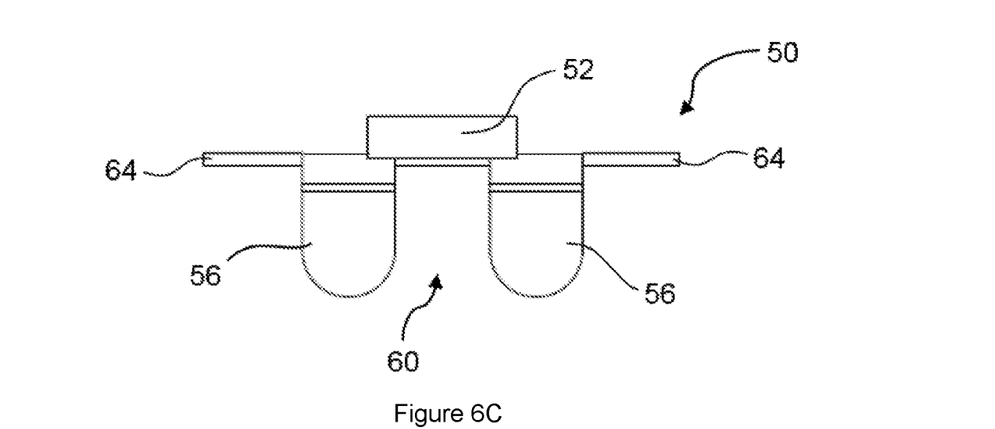
FIG. 6C is an end view of the one or more contact springs of FIG. 6A.

FIGS. 6A, 6B, and 6C illustrate the one or more contact springs 50 including one or more spring contacts 52 at a first end and one or more anchor legs 56 at a second end. The one or more spring contacts 52 extend at an angle γ relative to a spring arm 62. The spring arm 62 extends between the one or more spring contacts 52 and a body 57. The one or more anchor legs 56 are received and secured in complementary anchor leg recesses (not shown) in the one or more printed circuit board (not shown). A leg gap 60 is located between the one or more anchor legs 56. The body 57 of the one or more contact springs 50 includes a connection pad 58. One or more bias bumps 54 are located on the one or more contact springs 50. The body includes support arms 64 extending laterally outward therefrom.

Figure 7A:
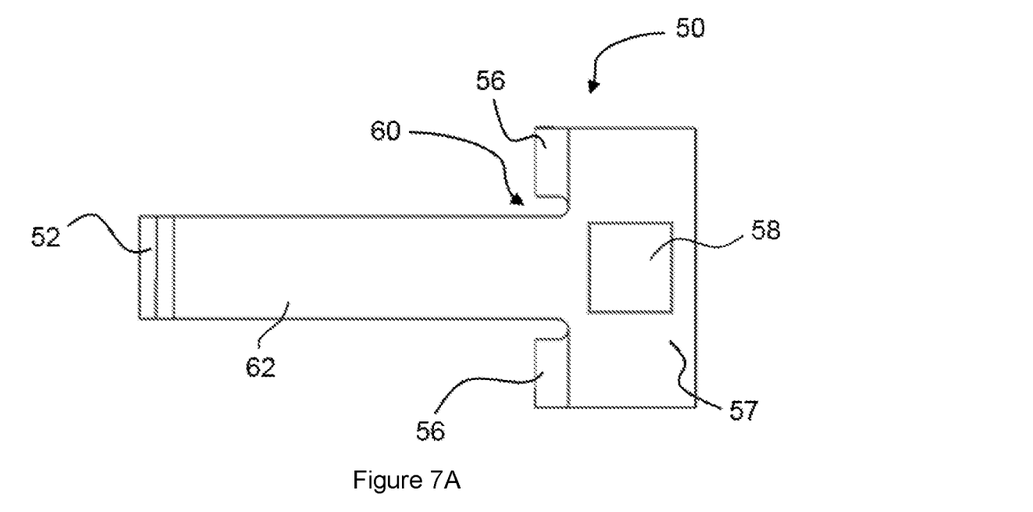
FIG. 7A illustrates a plain view of one or more contact springs.
Figure 7B:
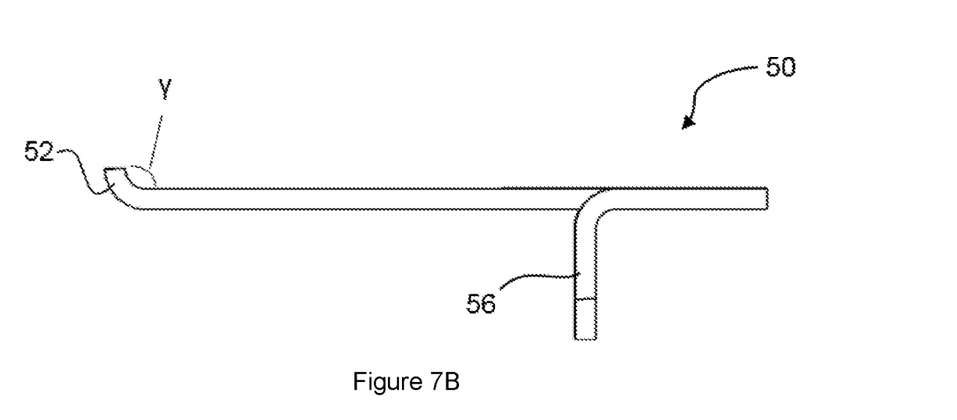
FIG. 7B is a side view of the one or more contact springs of FIG. 7A.
Figure 7C:
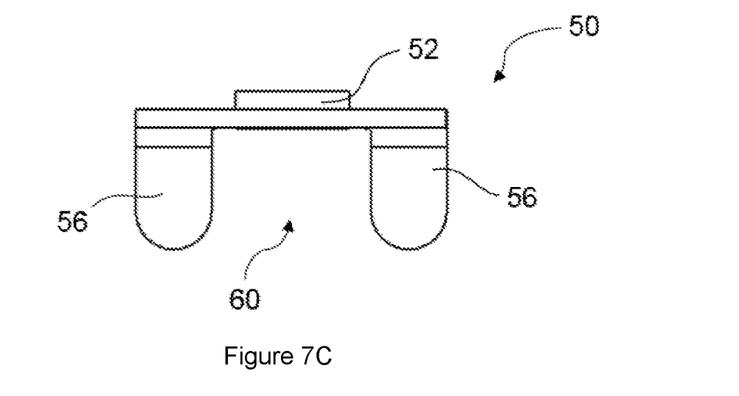
FIG. 7C is an end view of the one or more contact springs of FIG. 7A.

FIGS. 7A, 7B, and 7C illustrate the one or more contact springs 50 including one or more spring contacts 52 at a first end and a body 57 at a second end. The one or more spring contacts 52 extend at an angle γ relative to a spring arm 62. The spring arm 62 extends between the one or more spring contacts 52 and the body 57. The body 57 of the one or more contact springs 50 includes a connection pad 58 and one or more anchor legs 56. The one or more anchor legs are located on a side of the body 57 facing the one or more spring contacts 52. The one or more anchor legs 56 are received and secured in complementary anchor leg recesses (not shown) in the one or more printed circuit board (not shown). A leg gap 60 is located between the one or more anchor legs 56.

Figure 8:
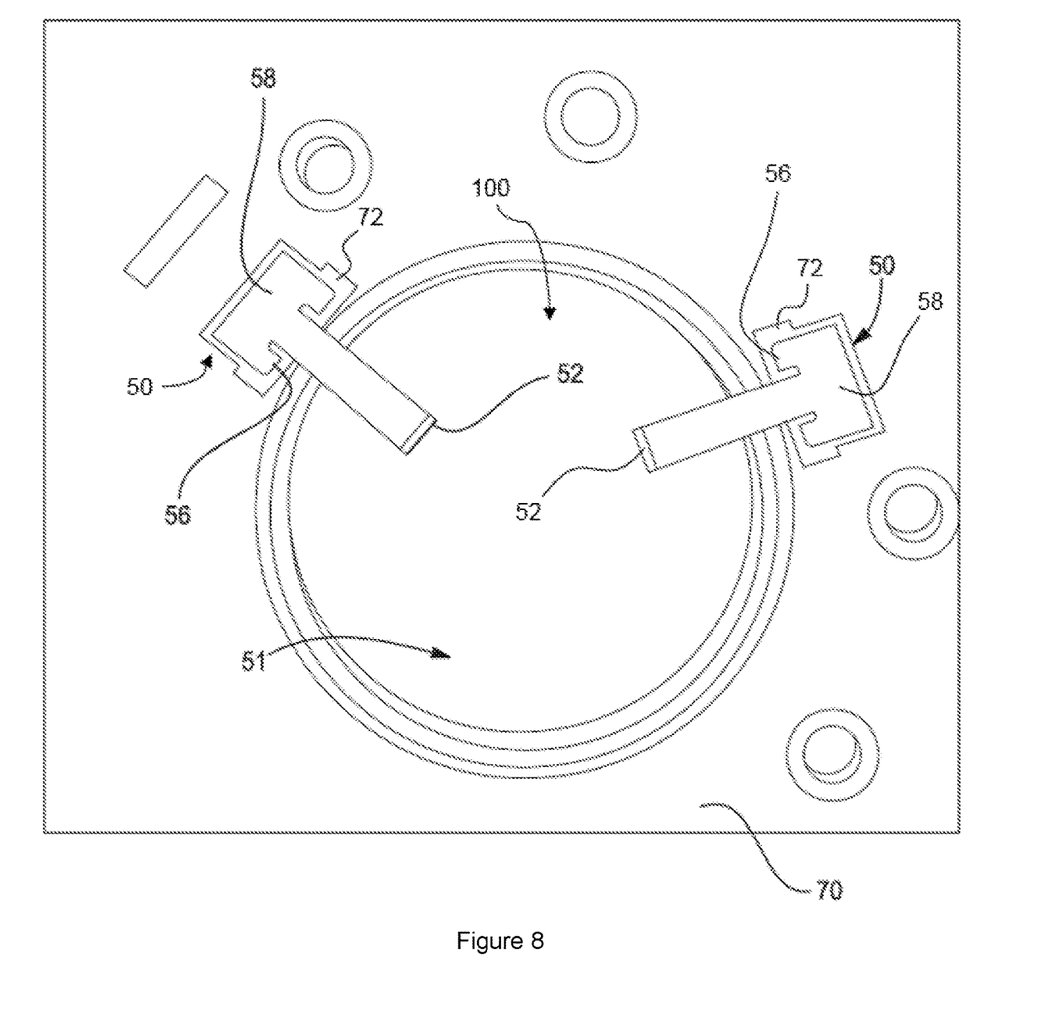
FIG. 8 illustrates a plan view of one or more contact springs, in an uninstalled state, connected to the printed circuit board.

FIG. 8 illustrates a plan view of a printed circuit board 70 including two of one or more contact springs 50 in an uninstalled state 100. The one or more contact springs 50 include one or more anchor legs 56, a connection pad 58, and one or more spring contacts 52. The one or more anchor legs 56 extend into the printed circuit board 70 while the connection pad 58 is in contact with the printed circuit board 70. The one or more spring contacts 52 extends cantilever into a central aperture 51 of the printed circuit board 70.

Figure 9:
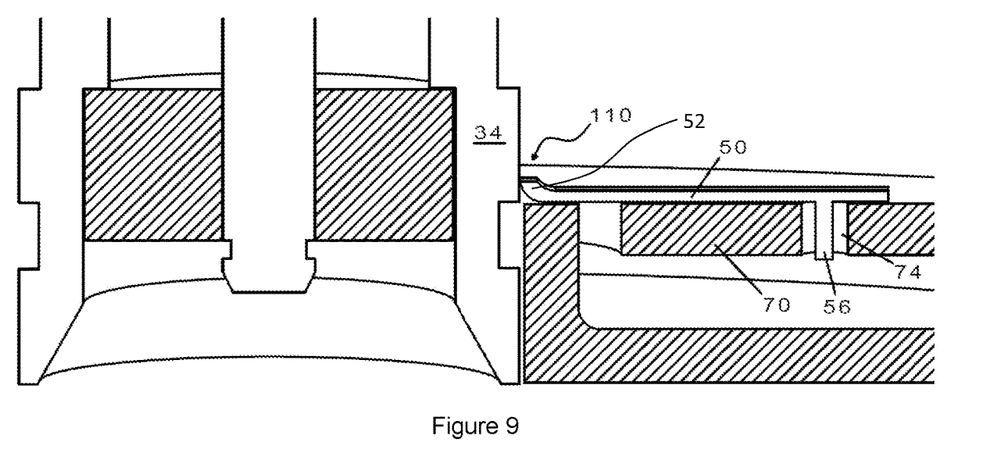
FIG. 9 is a side perspective view of the one or more contact springs in an installed state.

FIG. 9 illustrates a side perspective view of the one or more contact springs 50 in an installed state 110. The one or more contact springs 50 include one or more spring contacts 52 that extends from the printed circuit board 70 toward the one or more arbors and contacts the one or more arbors 34. The printed circuit board 70 has an anchor leg recess 74, through which the one or more anchor legs 56 extend.

Figure 10:
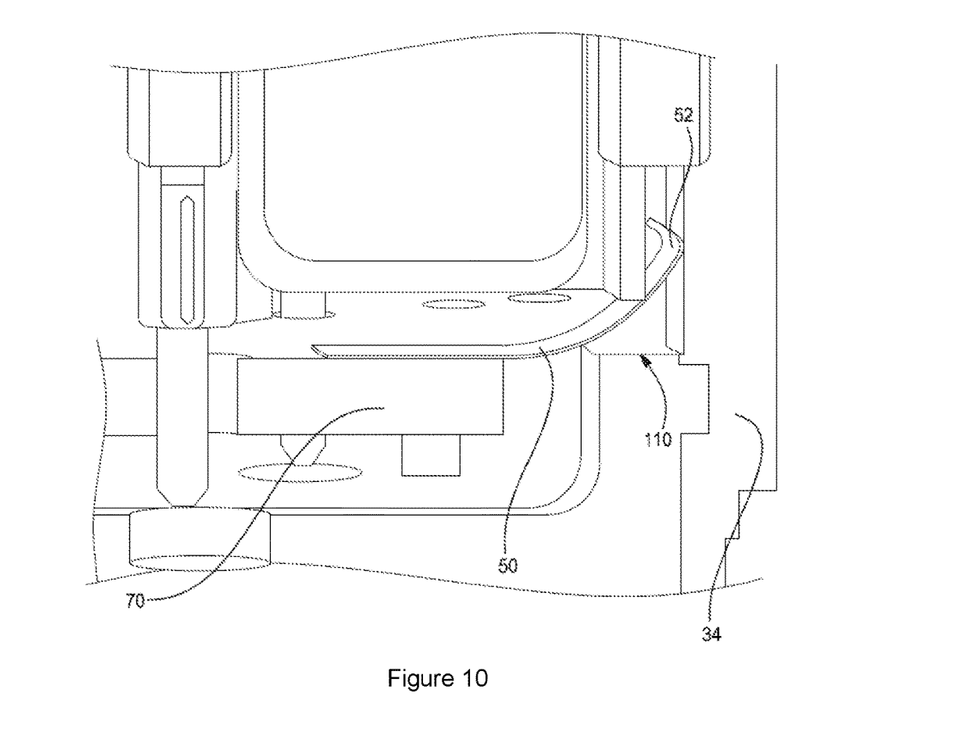
FIG. 10 illustrates a side view of the one or more contact springs in an installed state.

FIG. 10 illustrates a side view of the one or more contact springs 50 in the installed state 110. The one or more contact springs 50 is bent by contacting the one or more arbors 34 with the one or more spring contacts 52 when the printed circuit board 70 is installed around the one or more arbors 34.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps. By use of the term "may" herein, it is intended that any described attributes that "may" be included are optional.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

2 Blower
4 Housing
6 Impeller
10 Rotor
12 Cup
14 Magnet
16 Impeller shaft
30 Stator
32 Motor coil
34 Arbor
38 Bearing
40 Stator feet
42 Gap
50 Contact spring
51 Central aperture
52 Spring contact
54 Bias bumps
56 Anchor legs
57 Body
58 Connection pad
60 Leg gap
62 Spring arm
64 Support arm
70 Printed circuit board (PCB)
72 Connection plate
74 Anchor leg recess
88 Electromagnetic radiation (EMR)
90 Ground path/traces
91 Fan connector
92 Ground
100 Uninstalled
110 Installed
α Angle
β Angle
γ Angle

We claim:
1. A blower comprising:
 a. a rotor including:
  i. one or more magnets; and
  ii. an impeller having a cup that receives the one or more magnets;
 b. a stator including:
  i. an arbor; and
  ii. motor windings;
 c. a printed circuit board; and
 d. an aperture located between the printed circuit board and the arbor, the arbor is configured to extend through the aperture; and
 e. one or more contact springs that are connected to the printed circuit board and extend over the aperture
  wherein the arbor is in contact with the one or more contact springs to ground the arbor.

2. The blower of claim 1, wherein the one or more contact springs include one or more spring contacts that connect the one or more contact springs to the arbor.

3. The blower of claim 2, wherein the one or more anchor legs are located between one or more connection pads and the one or more spring contacts.

4. The blower of claim 2, wherein the one or more spring contacts extend at an angle relative to a spring arm in a direction of the arbor extending through the aperture.

5. The blower of claim 4, wherein the spring arm is connected to a body and forms a cantilevered connection with the body.

6. The blower of claim 4, wherein the spring arm is deflected when the spring arm is in contact with the arbor.

7. The blower of claim 4, wherein the spring arm extends within a single plane when the spring arm is in contact with the arbor.

8. The blower of claim 4, wherein the angle of the one or more spring contacts relative to a body of the one or more contact springs is about 25 degrees or more and about 105 degrees or less.

9. The blower of claim 4, wherein the direction the one or more spring contacts extend is in an opposite direction as one or more anchor legs.

10. The blower of claim 1, wherein the one or more contact springs include one or more anchor legs that extend into the printed circuit board to connect the one or more contact springs to the printed circuit board.

11. The blower of claim 1, wherein the one or more contact springs include one or more bias bumps.

12. The blower of claim 11, wherein the one or more bias bumps bias the one or more contact springs relative to the printed circuit board, the arbor, or both.

13. The blower of claim 11, wherein the one or more bias bumps are located between one or more spring contacts and one or more anchor legs.

14. The blower of claim 1, wherein the one or more contact springs are free of one or more bias bumps.

15. The blower of claim 1, wherein the one or more contact springs are a single contact spring.

16. The blower of claim 1, wherein the aperture is a central aperture defined in the printed circuit board.

17. The blower of claim 16, wherein the one or more contact springs extend radially towards a center of the aperture.

18. The blower of claim 1, wherein the one or more contact springs include one or more support arms.

19. The blower of claim 1, wherein the one or more contact springs are free of support arms.

20. The blower of claim 1, wherein the one or more contact springs are planar when the one or more contact springs are in contact with the arbor and the printed circuit board.

* * * * *

UNITED STATES PATENT AND TRADEMARK OFFICE
CERTIFICATE OF CORRECTION

| | |
|---|---|
| PATENT NO. | : 10,651,709 B2 |
| APPLICATION NO. | : 15/964203 |
| DATED | : May 12, 2020 |
| INVENTOR(S) | : Chad Vincent Pacilli et al. |

It is certified that error appears in the above-identified patent and that said Letters Patent is hereby corrected as shown below:

On the Title Page

(73) Assignee:
Please delete "GENTHERM INCORPORATED, Northville, MI (US)"
Please insert -- GENTHERM GMBH, Odelzhausen (DE) --

Signed and Sealed this
Ninth Day of July, 2024

Katherine Kelly Vidal
*Director of the United States Patent and Trademark Office*